United States Patent [19]
Ueda

[11] Patent Number: 5,959,931
[45] Date of Patent: Sep. 28, 1999

[54] MEMORY SYSTEM HAVING MULTIPLE READING AND WRITING PORTS

[75] Inventor: Tooru Ueda, Kanagawa, Japan

[73] Assignee: Sony Corporation, Tokyo, Japan

[21] Appl. No.: 09/098,429

[22] Filed: Jun. 17, 1998

[30] Foreign Application Priority Data

Jun. 18, 1997 [JP] Japan ................................ P09-161503

[51] Int. Cl.⁶ .............................. G11C 8/00; G11C 16/04
[52] U.S. Cl. ................................ 365/230.05; 365/230.08; 365/189.05
[58] Field of Search ......................... 365/230.05, 230.08, 365/189.05

[56] References Cited

U.S. PATENT DOCUMENTS

| | | | |
|---|---|---|---|
| 4,933,899 | 6/1990 | Gibbs | 365/230.05 |
| 5,260,908 | 11/1993 | Ueno | 365/230.05 |
| 5,790,461 | 8/1998 | Holst | 365/230.05 |

*Primary Examiner*—Trong Phan
*Attorney, Agent, or Firm*—Hill & Simpson

[57] ABSTRACT

A multi-port type semiconductor memory device which can reduce the number of bit lines, the size of a memory, and the power consumption, wherein write and read operations are carried out by using a pair of bit lines in common; at the time of a write operation the levels of the bit lines are determined in response to write data, and the levels of first and second memory nodes are determined via a writing port WPT and maintained by latch circuits; at the time of a read operation, in response to the levels of the first and the second memory nodes, the levels of the bit lines are determined via a first and a second reading ports and read data is output in accordance with the levels of the bit lines by a sense amplifier.

9 Claims, 8 Drawing Sheets

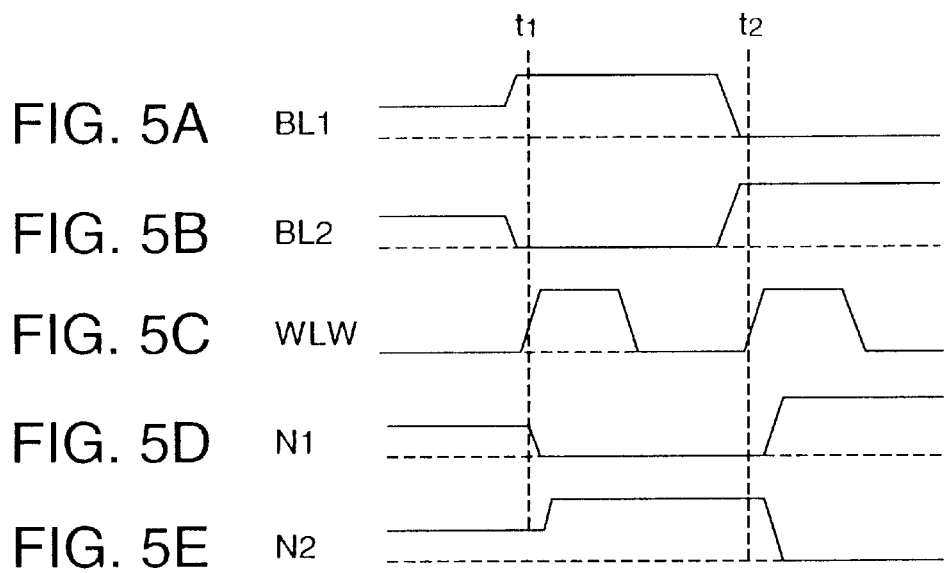
FIG. 5A BL1
FIG. 5B BL2
FIG. 5C WLW
FIG. 5D N1
FIG. 5E N2
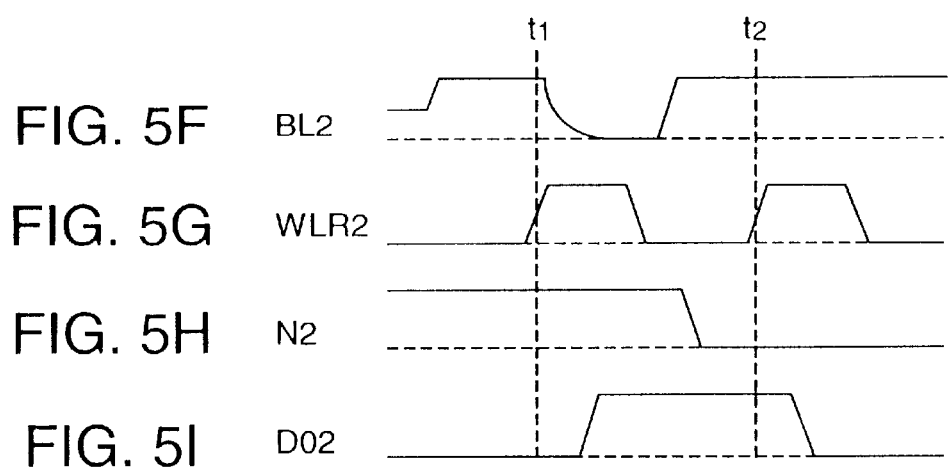
FIG. 5F BL2
FIG. 5G WLR2
FIG. 5H N2
FIG. 5I DO2

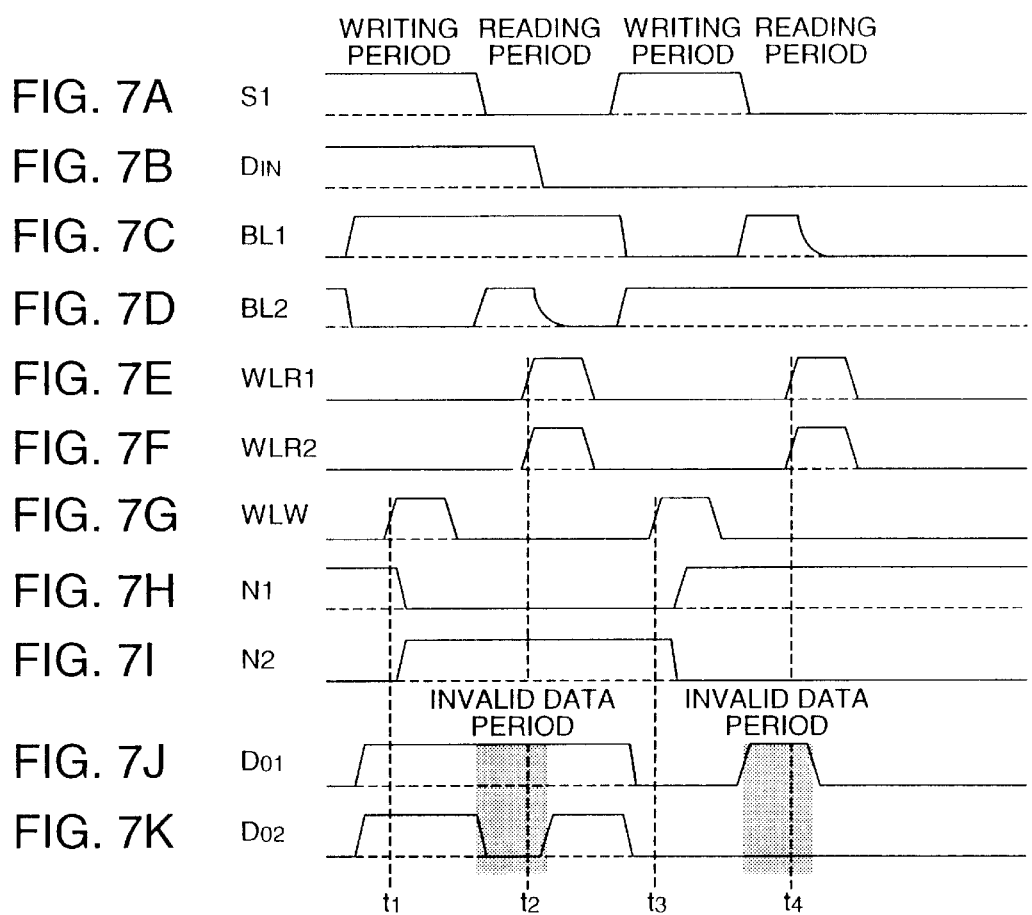

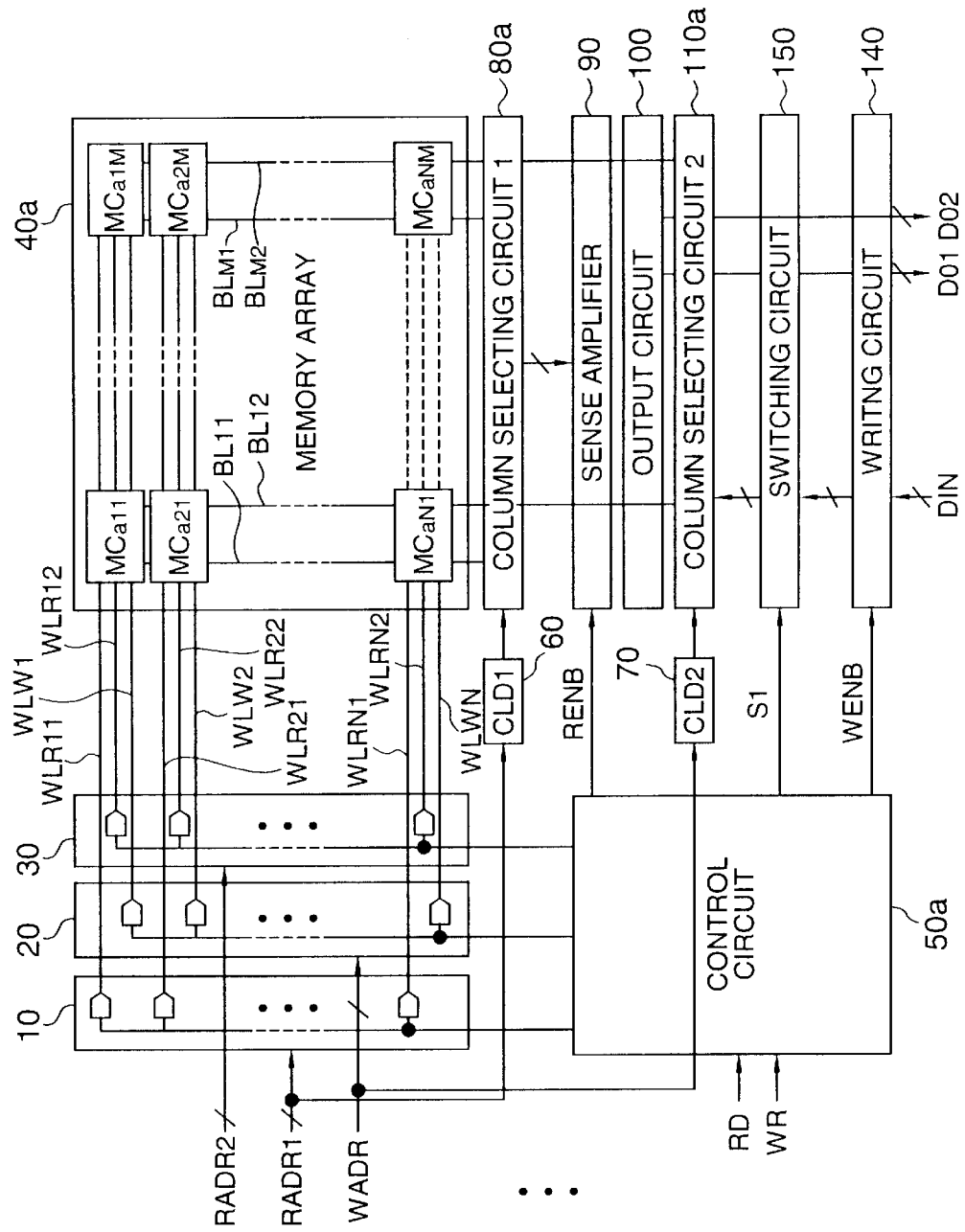

MEMORY SYSTEM HAVING MULTIPLE READING AND WRITING PORTS

BACKGROUND OF THE INVENTION

1. Field of the Invention

The present invention relates to a multi-port type semiconductor memory having multi-ports consisting of a plurality of ports for writing and reading data.

2. Description of the Related Art

FIG. 1 is a view of an example of a multi-port type memory cell having a plurality of ports for writing and reading data. As shown in FIG. 1, the multi-port type memory cell of this example is a one-writing port two-reading port type memory cell having a writing port consisting of transistors TWL1, TWL2, TWR1, and TWR2, a first reading port RPT1 consisting of transistors TR11 and TR12, and a second reading port RPT2 consisting of transistors TR21 and TR22.

In the writing port, the gates of the transistors TWL1 and TWR1 are connected in common to a write word line WLW, and the drains are connected to nodes N1 and N2. The gates of the transistors TWL2 and TWR2 are respectively connected to write bit lines BLW1 and BLW2, and the drains are connected to sources of the transistors TWL1 and TWL2. The sources of the transistors TWL2 and TWR2 are both connected to the ground line.

When writing, the write word line WLW is activated by a decoder (not shown) to, for example, be held at a high level. As a result, the transistors TWL1 and TWR1 are turned on (made conductive). The on/off state of the transistors TWL2 and TWR2 are controlled according to the potential of the write bit lines BLW1 and BLW2. As a result, the potentials of the nodes N1 and N2 are set at a high level or low level.

The potential levels of the memory nodes N1 and N2 set by the write operation are held by latch circuits. The states thereof are maintained as they are until the levels can be changed by the next write operation.

At the reading port RPT1, the gate of the transistor TR11 is connected to the reading word line WLR1, a first diffusion layer is connected to the read bit line BLR1, and a second diffusion layer is connected to a first diffusion layer of the transistor TR12. The gate of the transistor TR12 is connected to the node N1, and a second diffusion layer thereof is connected to the ground line. At the reading port RPT1, in response to application of a read pulse signal to the reading word line WLR1, a signal corresponding to the level of the node N1 is read out to the read bit line BLR1.

At the reading port RPT2, the gate of the transistor TR21 is connected to the reading word line WLR2, a first diffusion layer is connected to the read bit line BLR2, and a second diffusion layer is connected to a first diffusion layer of the transistor TR22. The gate of the transistor TR22 is connected to the node N2, and a second diffusion layer thereof is connected to the ground level. At the reading port RPT2, in response to application of a read pulse signal to the reading word line WLR1, a signal corresponding to the level of the node N2 is read out to the read bit line BLR1.

The memory cell shown in FIG. 1 is connected to one write word line WLW, two reading word lines WLR1 and WLR2, two write bit lines BLW1 and BLW2, and two read bit lines BLR1 and BLR2.

FIG. 2 is a view of the configuration of a memory cell MC, a write circuit 4, a first read circuit 2, and a second read circuit 3 in a multi-port type memory consisting of the memory cell shown in FIG. 1.

As shown in FIG. 2, the write bit lines BLW1 and BLW2 and the read bit lines BLR1 and BLR2 are respectively connected via a column selecting circuit 1 to the write circuit 4 and the read circuits 2 and 3.

The column selecting circuit 1 is configured by transfer gates TGR1, TGR2, TGW1, and TGW2. Note that these transfer gates are controlled by a column decoder which is not shown. The column decoder turns the transfer gates on and off in response to a column address signal.

The read circuit 2 is formed by a pMOS transistor PT1 and an inverter INVR1. The source and the drain of the pMOS transistor PT1 are connected respectively to a line supplying a power supply voltage $V_{DD}$ and the transfer gate TGR1, while the gate is connected to an input terminal of a precharge control signal Pr. An input terminal of the inverter INVR1 is connected to the transfer gate TGR1, and an output terminal is connected to an output terminal of a read data $D_{01}$.

The read circuit 3 is formed by a pMOS transistor PT2 and an inverter INVR2. The source and the drain of the pMOS transistor TR2 are connected respectively to the line supplying the power source voltage $V_{DD}$ and a transfer gate TGR2, while the gate is connected to the input terminal of the precharge control signal Pr. An input terminal of the inverter INVR2 is connected to the transfer gate TGR2, and an output terminal is connected to an output terminal of the read data $D_{02}$.

The write circuit 4 is formed by buffers BUF1 and BUF2 and an inverter INVR. An input terminal of the buffer BUF1 is connected to an input terminal of write data $D_{IN}$, while an output terminal is connected to the transfer gate TGW1. An input terminal of the inverter INVR is connected to an input terminal of the write data $D_{IN}$, an output terminal is connected to an input terminal of the buffer BUF2, and an output terminal of the buffer BUF2 is connected to the transfer gate TGW2.

When writing, the write data $D_{IN}$ is input via the write circuit 4 to write bit lines BLW1 and BLW2. At this time, the transfer gates TGW1 and TGW2 in the column selecting circuit 1 are turned on by the column decoder. Accordingly, the write data $D_{IN}$ is input to the writing port WPT. In response to the application of the writing pulse signal to the write word line WLW, data on the write bit lines BLW1 and BLW2 are written in a memory cell MC. As a result of this write operation, levels of the memory nodes N1 and N2 are set in response to the write data $D_{IN}$ and maintained by latch circuits.

When reading, first, the precharge control signal Pr is held at the low level. In response to this, the pMOS transistors PT1 and PT2 in the read circuits 2 and 3 are turned on, therefore both of the read bit lines BLR1 and BLR2 are precharged, for example, to the level of the power supply voltage $V_{DD}$. After the precharging, in response to the application of the reading pulse signal to the read word lines WLR1 and WLR2, a signal corresponding to the level of the memory nodes N1 and N2 in the memory cell is read out by the reading ports RPT1 and RPT2 to the read bit lines BLR1 and BLR2.

For example, when the potential of the node N1 is held at the high level and the node N2 at the low level, the transistor TR12 in the reading port RPT1 is turned on. Accordingly, the read bit line BLR1 is discharged, for example, to the ground potential GND. On the other hand, at the reading port RPT2, the transistor TR22 is turned off (made nonconductive), therefore the read bit line BLR2 is maintained at the precharged potential.

At this time, the transfer gate TGR1 or TGR2 in a column selecting circuit 1 is turned on by the column decoder, therefore the signal on the read bit lines BLR1 and BLR2 is transferred to the read circuit 2 or 3 and read out by these read circuits as data $D_{01}$ or $D_{02}$, respectively.

At a read operation, it is possible for the reading ports RPT1 and RPT2 to operate simultaneously as well as separately.

FIG. 3 is a view of the overall configuration of a semiconductor memory.

As shown in FIG. 3, the semiconductor memory device comprises row decoders 10, 20, and 30, a memory array 40, a control circuit 50, first and second column decoders 60 and 70, a first column selecting circuit 80, a first sense amplifier 90, a first output circuit 100, a second column selecting circuit 110, a second sense amplifier 120, a second output circuit 130, and a write circuit 140.

The row decoder 10 receives a read address RADR1, selects one of the read word lines WLR11, WLR21, . . . , WLRN1 in response to the received read address, and activates the selected word line, for example, to maintain the selected word line at the high level.

The row decoder 30 receives a read address RADR2, selects one of the reading word lines WLR12, WLR22, . . . , WLRN2 in response to the received read address, and activates the selected word line.

The row decoder 20 receives a write address RADR, selects one of the writing word lines WLW12, WLW22, . . . , WLWN2 in response to the received write address, and activates the selected word line.

The memory array 40 comprises, for example, M×N number of memory cells consisting of $MC_{11}$, . . . , $MC_{1M}$, $MC_{21}$, . . . , $MC_{2M}$, . . . , $MC_{N1}$, . . . , $MC_{NM}$ arranged in a matrix as shown in FIG. 3 and connected to read word lines, write word lines, read bit lines, and write bit lines.

Note that the configuration of each memory cell $MC_{11}$, . . . , $MC_{1M}$, $MC_{21}$, . . . , $MC_{2M}$, . . . , $MC_{NN1}$, . . . , $MC_{NM}$ is the same as that of the memory cell shown in FIG. 1.

The control circuit 50, in response to a read signal RD and a write signal WR input from outside the semiconductor memory, outputs read enable signals RENB1 and RENB2 to sense amplifiers 90 and 120 and a write enable signal WENB to the write circuit 140, respectively.

A column decoder 60 (CLD1) receives a read address RADR1 and controls a column selecting circuit 80 in response to the received read address RADR1. For example, the column decoder 60 selects a transfer gate in the column selecting circuit 80 in response to a column address of a read address signal RADR1 and turns on the selected transfer gate.

A column decoder 70(CLD2) receives a write address WADR and controls a column selecting circuit 110 in response to the received write address WADR. For example, the column decoder 70 selects a transfer gate in the column selecting circuit 110 in response to a column address in write address signal WADR and turns on the selected transfer gate.

The signal selected by the column selecting circuit 80 is detected by a sense amplifier 90, and the detected result is output via an output circuit 100 outside of the semiconductor memory as read data D01.

In the same way, the signal selected by the column selecting circuit 110 is detected by a sense amplifier 120, and the detected result is output via an output circuit 130 outside the semiconductor memory as read data D02.

Write data DIN is input via the write circuit 140 and selected by the column selecting circuit 110. The selected data is input to the predetermined memory cell and stored there.

In the semiconductor memory cell shown in FIG. 3, at the time of a write operation, a predetermined word line is selected from among the write word lines WLW1, WLW2, . . . , WLWN by the row decoder 20 in response to a write address signal WADR and activated. A column selecting circuit 110 is controlled by the column decoder 70, and a predetermined transfer gate is turned on. As a result, write data DIN input through the write circuit 140 is selected by the column selecting circuit 110 and is written in a memory cell selected by the row decoder 20.

During the read operation, in response to read address signals RADR1 or RADR2, the predetermined word line is selected from the read word lines WLR11, WLR21, . . . , WLRN1 by the row decoder 10 or 30 and activated.

The stored data in the memory cells connected to the selected read word line is read out by the reading port to the read bit line selected by the column selecting circuit 80 and output outside of the semiconductor memory as the read data D01 and D02.

The above semiconductor memory requires two write bit lines and two read bit lines per bit and thus requires four bit lines in total per bit. Therefore, when forming a memory array of N number of words and M number of bits, 4M number of bit lines are required. The number of read bit lines is therefore large. It consequently suffers from the disadvantage that the size of the memory array becomes large. Also, along with the increase of the number of the bit lines, the power consumption becomes large due to the data setting and the precharging during the write and read operations.

In the above structure of a memory cell, the number of the read ports can be easily increased by providing additional pairs of nMOS transistors consisting reading ports, read word lines, and bit lines. When the number of the read ports is set to K, (K+2)×M number of bit lines are required. A large increase of the number of bit lines is therefore inevitable.

SUMMARY OF THE INVENTION

An object of the present invention is to provide a semiconductor memory having multi-ports in which the number of bit lines, the area of the memory, and the power consumption can be reduced.

According to the present invention, there is provided a semiconductor memory device comprising a memory circuit having a first memory node and a second memory node; a pair of bit lines; a write word line; a read word line; a write port circuit including a first pair of write transfer gate circuits where control gates are connected to the write word line and terminals thereof are respectively connected to the first and second memory nodes of the memory circuit and a second pair of write transfer gate circuits where control gates are respectively connected to first and second bit lines, first terminals are respectively connected to second terminals of the first pair of write transfer gate circuit, and second terminals are connected to a first voltage line; a read port circuit including a first read transfer gate circuit where a control gate is connected to the read word line and one terminal is connected to one of the pair of bit lines and a second read transfer gate circuit wherein a control gate is connected to one of the first and second memory nodes of the memory circuit, a first terminal is connected to a second terminal of the first read transfer gate circuit, and a second terminal is connected to the first voltage line.

During a write operation, the write word line is energized to place the first pair of write transfer gate circuits in the write port circuit in the conductive state, the potentials of the pair of bit lines are inversely set in response to write data, and the write port circuit is operated by the potentials of the pair of bit line to hold the write data in the memory cell.

During a read operation, the read word line is energized to place the first read transfer gate circuit in the read port in a conductive state, the second read transfer gate circuit operates in response to the potential at the control gate thereof to define the potential of one of the pair of bit lines connected to one terminal of the first read transfer gate circuit, and the potential on the bit line is sensed to provide read data.

Preferably, the memory circuit comprises a first inverter provided between the first and second memory nodes and a second inverter provided anti-parallel to the first inverter between the first and second memory nodes and the first and second inverters form a latch circuit.

More preferably, the first pair of write transfer gate circuits comprises a pair of transistors, and the second pair of write transfer gate circuits comprises a pair of transistors.

Preferably, the first read transfer gate circuit comprises a transistor and the second read transfer gate circuit comprises a transistor.

Preferably, the first voltage line is the ground potential line.

Preferably, the semiconductor memory device further comprises a second read word line and second read port circuit. The second read port circuit includes a third read transfer gate circuit wherein a control gate is connected to the second read word line and a first terminal is connected to the second pair of bit lines and including a fourth read transfer gate circuit wherein a control gate is connected to the another of the first and second memory nodes of the memory circuit, a first terminal is connected to a second terminal of the third read transfer gate circuit, and a second terminal is connected to the first voltage line. At the time of a read operation, the read word line and the second read line are energized to place the first and third read transfer gate circuits in the conductive state, the second read transfer gate circuit operates in response to the potential at the control gate thereof and the fourth read transfer gate circuit operates in response to the potential at the control gate thereof to define the potentials of the pair of bit lines, and the potentials on the pair of bit lines are sensed.

More preferably, the third read transfer gate circuit comprises a transistor and the second read transfer gate circuit comprises a transistor.

Still more preferably, the semiconductor memory device further comprises a switching circuit connected to the pair of bit lines, a data read circuit, and a data write circuit. The switching circuit selects the data write circuit to operatively connect the bit lines and the data write circuit during a write operation and selects the data read circuit to operatively connect the bit lines and the data read circuit during a read operation.

Preferably, the data read circuit comprises a precharge circuit for precharging the bit lines to a precharge potential during a read operation.

BRIEF DESCRIPTION OF THE DRAWINGS

These and other objects and features of the present invention will become clearer from the following description of the preferred embodiments given with reference to the accompanying drawings, in which:

FIGS. 5A to 5I are views of waveforms illustrating the operation of a multi-port type semiconductor memory of the present invention;

FIGS. 7A to 7K are views of waveforms illustrating the operation of the partial circuit of FIG. 6; and FIG. 8 is a view of the configuration of a multi-port type semiconductor memory of the present invention.

DESCRIPTION OF THE PREFERRED EMBODIMENTS

Below, preferred embodiments will be described with reference to the accompanying drawings.

Figure 4:
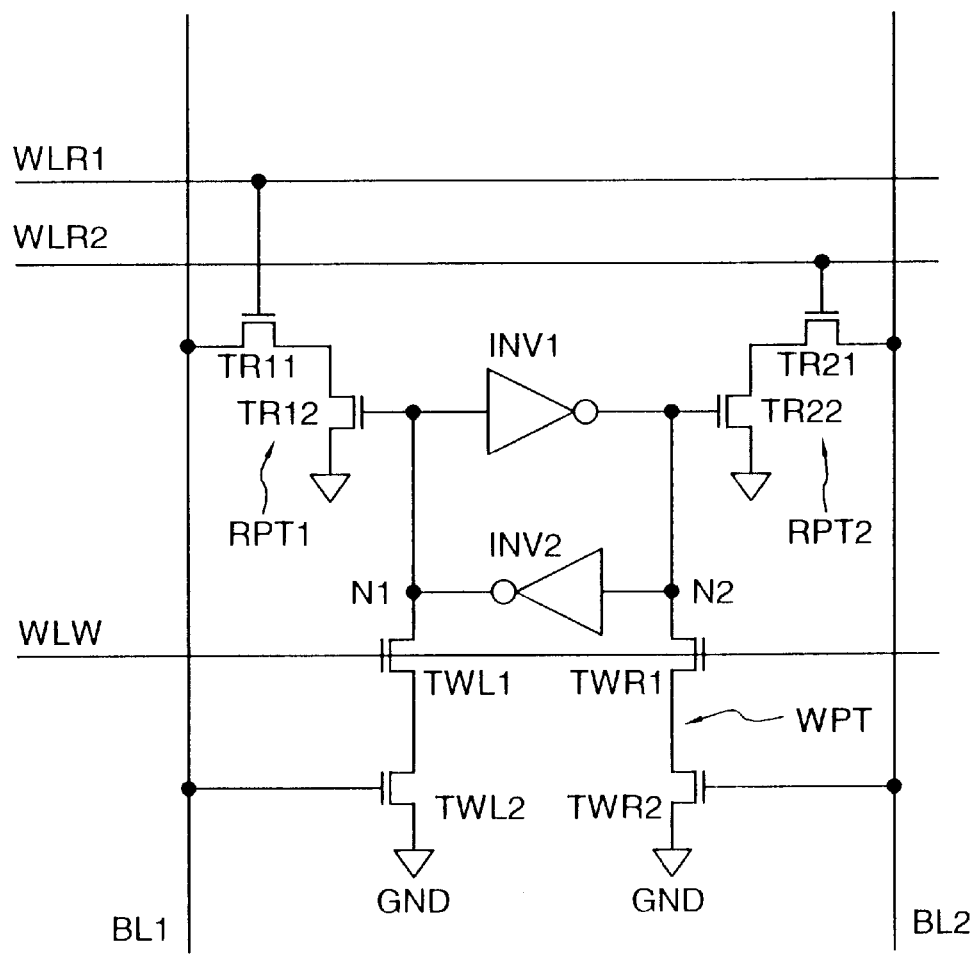
FIG. 4 is a circuit diagram of a multi-port type semiconductor memory according to an embodiment of the present invention.

FIG. 4 is a circuit diagram of a semiconductor memory according to an embodiment of the present invention and shows the configuration of a memory cell.

As shown in FIG. 4, a memory cell according to the present embodiment is a multi-port type memory cell having one writing port and two reading ports. A writing port WPT comprises transistors TWL1, TWR1, TWL2, and TWR2, a first reading port RPT1 comprises transistors TR11 and TR12, and a second reading port RPT2 comprises transistors TR21 and TR22.

As shown in FIG. 4, in the memory cell according to the present embodiment, a write bit line and a read bit line share a pair of bit lines, that is, the bit lines BL1 and BL2.

In the writing port WPT, the gates of transistors TWL1 and TWR1 are commonly connected to a write word line WLW, and the drains are connected to nodes N1 and N2, respectively. The gates of transistors TWL2 and TWR2 are respectively connected to the bit lines BL1 and BL2, and the drains are respectively connected to the sources of transistor TWL1 and TWL2. The sources of the transistors TWL1 and TWL2 are connected to the ground.

In the reading port RPT1, a gate of the transistor TR11 is connected to a read word line WLR1, a first diffusion layer is connected to the bit line BL1, and a second diffusion layer is connected to a first diffusion layer of the transistor TR12. The gate of the transistor TR12 is connected to the node N1, and a second diffusion layer is connected to the ground.

In the reading port RPT2, a gate of the transistor TR21 is connected to the read word line WLR2, a first diffusion layer is connected to a bit line BL2, and a second diffusion layer is connected to a first diffusion layer of the transistor TR22. A gate of the transistor TR22 is connected to the node N2, and a second diffusion layer is connected to the ground.

FIGS. 5A to 5I are waveforms illustrating the read and write operations of the multi-port type memory cell shown in FIG. 4. Below, an explanation will be made of the operation of the memory cell according to the present embodiment with reference to FIGS. 4 and 5A to 5I.

FIGS. 5A to 5E show the write operation of a memory cell. At the time of a write operation, the levels of the bit lines BL1 and BL2 are determined respectively in response to write data. As shown in FIGS. 5A to 5E, for example, after setting the bit line BL1 at a high level and the bit line BL2 at a low level, a high level writing pulse is applied to a write word line WLW, for example, by a decoder, at the time $t_1$. As a result, in the writing port WPT, the transistors TWL1 and TWR1 are turned on. Also, the transistor TWL2 is turned on and the transistor TWR2 is turned off in response to potentials of the bit lines BL1 and BL2. Therefore, the potential of the node N1 is discharged and held at a low level, for example, at the ground potential GND, and the node N2 is held at a high level, for example, at a power source voltage $V_{DD}$ level, by a latch circuit. After the write operation, the write word line WLW is held at the low level, and the potentials of the nodes N1 and N2 are held at the low level and high level, respectively, by latch circuits.

After the write operation, the levels of the bit lines BL1 and BL2 are reset, for example, in response to the write data. As shown in FIGS. 5A to 5E, for example, after maintaining the bit line BL1 at a low level and the bit line BL2 at high level, a high level writing pulse is applied to the write word line WLW by a row decoder at the time $t_2$. In response to this, the transistors TWL1 and TWR1 are turned on. Also, the transistor TWL2 is turned off and the transistor TWR2 is turned on in response to the potentials of the bit lines BL1 and BL2. Therefore, the node N2 is discharged and held at a low level, and the node N2 is held at a high level by latch circuits.

Waveforms during the read operation are shown in FIGS. 5F to 5I. As shown in FIGS. 5F to 5I, the read bit line BL2 is precharged to a predetermined potential level, for example, to the high level, before a read operation. At the time t1, for example, a high level reading pulse is applied to the read word line WLR2 by a decoder. In response to this, at the reading port RPT2 of the memory cell, the transistor TR21 is turned on. Also, since the node N2 is held at a high level, the transistor TR22 is turned on as well and the bit line BL2 is discharged and held at the level of the ground potential GND. Note that the potential of the bit line BL2 is detected, for example, by a sense amplifier. In response to the detected result, for example, as shown in FIGS. 5F to 5I, a high level read data $D_{O2}$ is output.

At the time t2, a high level reading pulse is applied to the read word line WLR2 by a row decoder. In response to this, at the reading port RPT2 of the memory cell, the transistor TR21 is turned on. Also, the node N2 is held at a low level, the transistor TR22 is turned off, and the bit line BL2 is held at a high level of a precharge state. The potential of the bit line BL2 is detected by a sense amplifier, and, in response to the detected result, for example, a low level read data D02 is output, as shown in FIGS. 5F to 5I.

Figure 6:
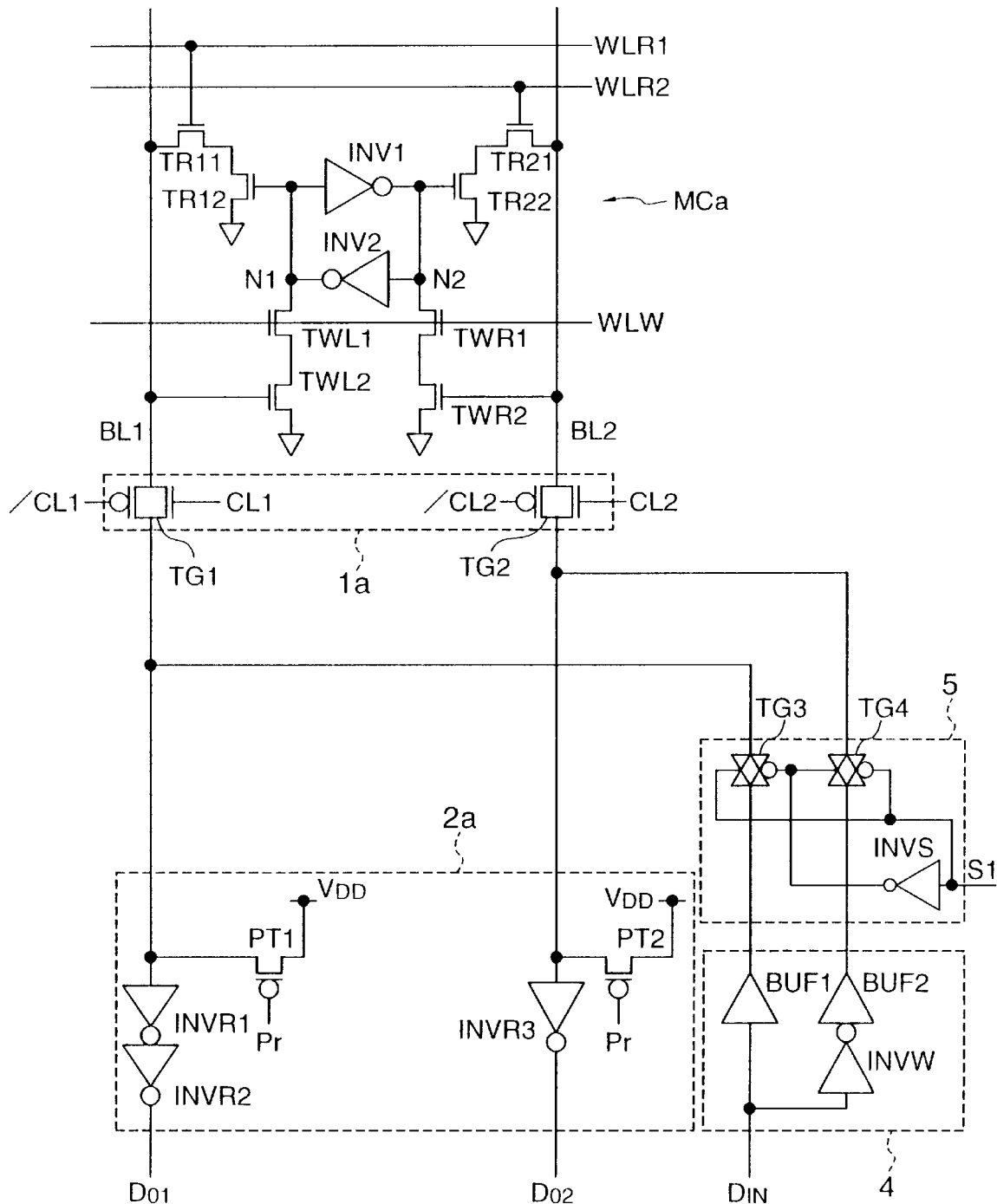
FIG. 6 is a partial circuit diagram of a multi-port type semiconductor memory of the present invention.

FIG. 6 is a circuit diagram of a partial configuration of a multi-port type memory consisting of the memory cells shown in FIG. 4. As shown in FIG. 6, the memory cell MCa has the same configuration as that of the memory cell shown in FIG. 4.

The bit lines BL1 and BL2 are respectively connected via the column selecting circuit 1a to a read circuit 2a and connected via the switching circuit 5 to the write circuit 4.

A column selecting circuit 1a comprises transfer gates TG1 and TG2 as shown in FIG. 6. These transfer gates are, as shown in FIG. 6, for example, commonly connected by drains. The gates are connected to the column signal lines CL1 and CL2 and the inverted column signal lines /CL1 and /CL2, respectively. The column signal lines CL1 and CL2 and the inverted column signal lines /CL1 and /CL2 are connected, for example, to a column decoder, not shown.

The column decoder sets the level of the respective column signal line or the inverted signal line in response to the input column address signal. Accordingly, the transfer gates TG1 and TG2 are turned on or off.

The read circuit 2a comprises pMOS transistors PT1 and PT2 and inverters INVR1, INVR2, and INVR3.

As shown in FIG. 6, a source and a drain of the pMOS transistor PT1 are connected to a line supplying the power source voltage $V_{DD}$ and to the transfer gate TG1, an input terminal of the inverter INVR1 is connected to an input terminal of the transfer gate TG1, an output terminal is connected to an input terminal INVR2, and an output terminal of the inverter INVR2 is connected to an output terminal of the read data $D_{O1}$. The source and the drain of pMOS transistor PT2 are connected to a line supplying the power source voltage $V_{DD}$ and to the transfer gate TG2, while the gate is connected to an input terminal of a precharge control signal Pr. An input terminal of the inverter INVR3 is connected to the transfer gate TG2, and an output terminal is connected to an output terminal of the read data $D_{O2}$.

At the time of a read operation, the read circuit 2a outputs the read data $D_{O1}$ and $D_{O2}$ in response to the level of the bit lines BL1 and BL2.

A write circuit 4 comprises buffers BUF1 and BUF2 and an inverter INVW.

An input terminal of the buffer BUF1 is connected to an input terminal of write data $D_{IN}$, while an output terminal is connected to the transfer gate TG3 in a switching circuit 5. An input terminal of the inverter INVW is connected to an input terminal of the write data Din, an output terminal is connected to an input terminal of the buffer BUF2, and an output terminal of the buffer BUF2 is connected to the transfer gate TG4 in the switching circuit 5.

The switching circuit 5 comprises transfer gates TG3 and TG4 and an inverter INVS.

An input terminal of the inverter INVS is connected to an input terminal of a switch control signal S1. An output terminal is connected to transfer gates TG3 and TG4, respectively. The on or off states of the transfer gates TG3 and TG4 are controlled in response to the switch control signal S1 and its inverted signal.

The switching circuit 5 having the above configuration carries out a switching operation in response to the switch control signal S1 indicating a read/write operation. For example, separating the write circuit 4 from the bit lines BL1 and BL2 in response to the switch control signal S1 at read operations, and connecting the write circuit 4 with the bit lines BL1 and BL2 in response to the switch control signal S1 at write operations.

According to the multi-port type memory having a structure as mentioned above, during a write operation, the write circuit 4 is connected to the bit lines BL1 and BL2 by the switching circuit 5. The potential of these bit lines are set in response to the write data $D_{IN}$. When a writing pulse is applied to a write word line WLW, the levels of the memory nodes N1 and N2 in the memory cell MCa are set in response to the data of the bit lines BL1 and BL2 selected by a column selecting circuit. After the write operation, the levels of the nodes N1 and N2 are maintained by latch circuits until the next write operation rewrites them.

At the time of a read operation, the write circuit is separated from the bit lines BL1 and BL2 by the switching circuit 5. The levels of the bit lines BL1 and BL2 are set in response to a reading pulse applied to the read word lines WLR1 or WLR2 and based on the levels of the nodes N1 and N2. Furthermore, signals of the bit lines BL1 and BL2 selected by the column selecting circuit 1a are input to the read circuit 2a, from which the read data $D_{O1}$ and $D_{O2}$ are output. Note that the read data $D_{O1}$ and $D_{O2}$ are signals having inverted logic levels.

FIGS. 7A to 7K are views of waveforms showing the write and read operations of the multi-port memory shown in FIG. 6. Below, a detailed explanation will be made of write and read operations with reference to FIGS. 6 and 7A to 7K.

At the time t1, a writing pulse is applied to the write word line WLW. At this time, because the switch control signal S1 is held at the high level, the write circuit 4 is connected to the bit lines BL1 and BL2. The levels of the bit lines BL1 and BL2 are set in response to the write data $D_{IN}$. As shown in FIGS. 7A to 7K, because the write data $D_{IN}$ is at a high level, the bit line BL1 is set at a high level, and the bit line BL2 is set at a low level, respectively.

When, for example, the bit lines BL1 and BL2 are selected by the column selecting circuit 1a, while a writing pulse is being applied to the word line WLW, the levels of the nodes N1 and N2 are respectively set in response to the levels of the bit lines BL1 and BL2 by a writing port WPT. As shown in FIGS. 7A to 7K, because the bit lines BL1 and BL2 are held at a high level and at a low level, respectively, the nodes N1 and N2 are held at a high level and a low level, respectively.

After the write operation is completed, the write word line WLW is held at a low level, and the data which was written to the memory cell MCa is stored by a latch circuit.

Next, at the time t2, a reading pulse is applied to the read word lines WLR1 and WLR2, and a read operation is carried out to the memory cell MCa. At this time, because a switch control signal S1 is held at a low level, the write circuit 4 is separated from the bit lines BL1 and BL2 at the switching circuit 5.

Before the read operation, the bit lines BL1 and BL2 are precharged to respectively predetermined levels. For example, as shown in FIGS. 7A and 7K, the respective bit lines BL1 and BL2 are precharged to a power source voltage level $V_{DD}$. While the read word lines WLR1 and WLR2 are being activated, the levels of the bit lines BL1 and BL2 are respectively set by a reading port in response to the levels of the nodes N1 and N2 in the memory cell MCa. As shown in FIGS. 7A to 7K, the nodes N1 and N2 are respectively held at a low level and at high level. In response to this, the bit line BL1 is held at the precharged level, that is, the high level, and the bit line BL2 is held at the low level.

When, for example, the bit lines BL1 and BL2 are selected by the column selecting circuit 1a, signals of these bit lines are input to the read circuit 2a. The read data $D_{O1}$ and $D_{O2}$ are output by a read circuit 2a. As shown in FIGS. 7A to 7K, high level read data $D_{O1}$ and low level read data $D_{O2}$ are output, respectively.

At the time $t_3$, the next writing pulse is applied to a write word line WLW, and a write operation is carried out to the memory cell MCa. Note that this write operation is almost same as that in the previous example, however, the write data $D_{IN}$ this time is held at a low level as shown in FIGS. 7A to 7K. As a result of the write operation in response to it, the node N1 is held at a high level and the node N2 at a low level.

Next, at the time $t_4$, a reading pulse is applied to the read word lines WLR1 and WLR2. In response to this, a read operation is carried out to the memory cell MCa. Note that this read operation is almost same as that in the previously mentioned read operation, however, the nodes N1 and N2 are respectively held at a high level and a low level at this time. As a result of the read operation, the low level read data $D_{O1}$ and the high level read data $D_{O2}$ are output, respectively.

As shown in FIGS. 7A to 7K, during the reading periods, the bit lines BL1 and BL2 are in an unstable condition immediately after applying a reading pulse, therefore, the read data $D_{O1}$ and $D_{O2}$ are invalid immediately after a read operation starts.

FIG. 8 shows the configuration of an example of a semiconductor memory consisting of the memory cells of the fifth embodiment. As shown in FIG. 8, a semiconductor memory according to the present embodiment comprises row decoders 10, 20, and 30, a memory array 40a, a control circuit 50a, column decoders 60 and 70, a column selecting circuit 110a, a switching circuit 150, and a write circuit 140.

The row decoder 10 receives a read address RADR1, selects a corresponding read word line from the read word lines WLR11, WLR21, . . . , WLRn1, and activates the selected word line, for example holds it at a high level.

The row decoder 30 receives a read address RADR2, selects a corresponding read word line from the read word lines WLR12, WLR22, . . . , WLRN2, and activates the selected word line.

A row decoder 20 receives a write address WADR, selects a corresponding write word line from the write word lines WLW1, WLW2, . . . , WLWN, and activates the selected word line.

A memory array 40 comprises, for example, M×N number of memory cells consisting of $MCa_{11}$, $MCa_{1M}$, $MCa_{21}$, . . . , $MCa_{2M}$, $MCa_{N1}$, . . . , $MCa_{NM}$ arranged in a matrix as shown in FIG. 8. Each of the memory cells is connected by a read word line, a write word line, a read bit line, and a write bit line.

The configuration of the memory cells $MCa_{11}$, $MCa_{1M}$, $MCa_{21}$, . . . , $MCa_{2M}$, $MCa_{N1}$, . . . , $MCa_{NM}$ is, for example, the same as the memory cells of the present embodiment shown in FIG. 4.

A control circuit 50a, in response to read signal RD and write signal WR input from outside, outputs a read enable signal RENB and a switch control signal S1 and a write enable signal WENB to a sense amplifier 90, a switching circuit 150 and a write circuit 140, respectively.

A column decoder 60 (CLD1) receives a read address RADR1 and controls a column selecting circuit 80a in response to the received read address. For example, the column decoder 60 selects a transfer gate in the column selecting circuit 110a in response to the column address in a read address signal RADR1 and turns the selected transfer gate on.

The column decoder 80a selects a predetermined bit line in response to a column selecting signal from the column decoder 60 and outputs read data of the selected bit line to the sense amplifier 90.

At the time of a read operation, the read data selected by the column selecting circuit 80a is detected by the sense amplifier 90, and the detected result is output via an output circuit 100 to the outside as the read data D01 and D02.

The read data DIN is input via a write circuit 140 to a switching circuit 150. The switching circuit 140 carries out a switching operation in response to a switch control signal S1 from a control circuit 50a. At the time of a read operation, it switches the write circuit 140 and a column selecting circuit 110a, while at the time of a write operation, it connects the write circuit 140 and the column selecting circuit 110a.

A column selecting circuit 110a selects a predetermined bit line in response to a column selecting signal from the column decoder 70 and inputs the write data from the switching circuit 150 to the selected bit line.

At the time of a write operation, the write data selected by the column selecting circuit 110a is output to the bit line and is written to the selected corresponding memory cell.

At the time of a write operation, the write data DIN is input via the write circuit 140 to the switching circuit 150 and selected by the column selecting circuit 110a, then the selected write data is input to a bit line and written in the selected memory cell.

At the time of a read operation, stored data in the selected memory cell is read out to a bit line, and the column selecting circuit 80a selects the read data in the predetermined bit line which is then input to the sense amplifier 90. The read data is detected by the sense amplifier 90, and the detected result is output via the output circuit 100 to the outside as the read data D01 and D02.

Figure 1:
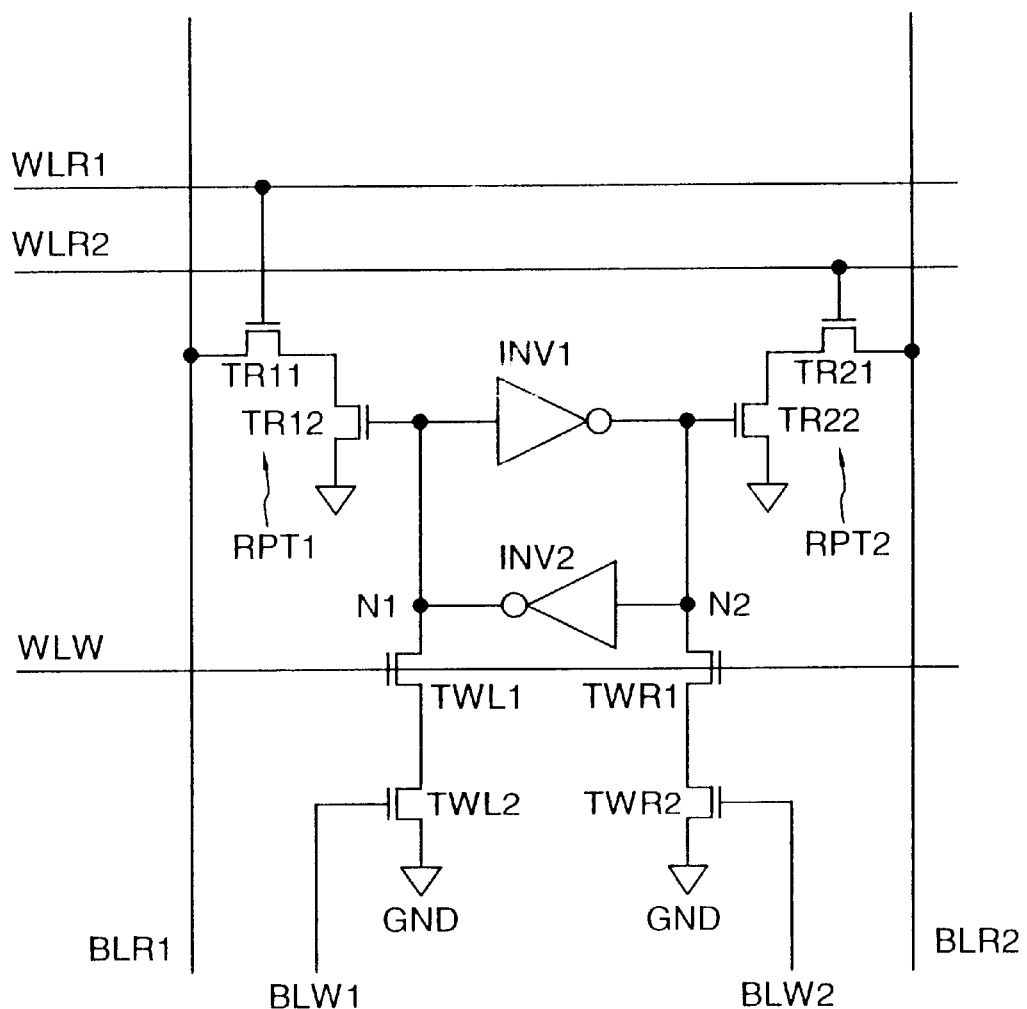
FIG. 1 is a circuit diagram of an example of a multi-port type memory cell of the related art.
Figure 2:
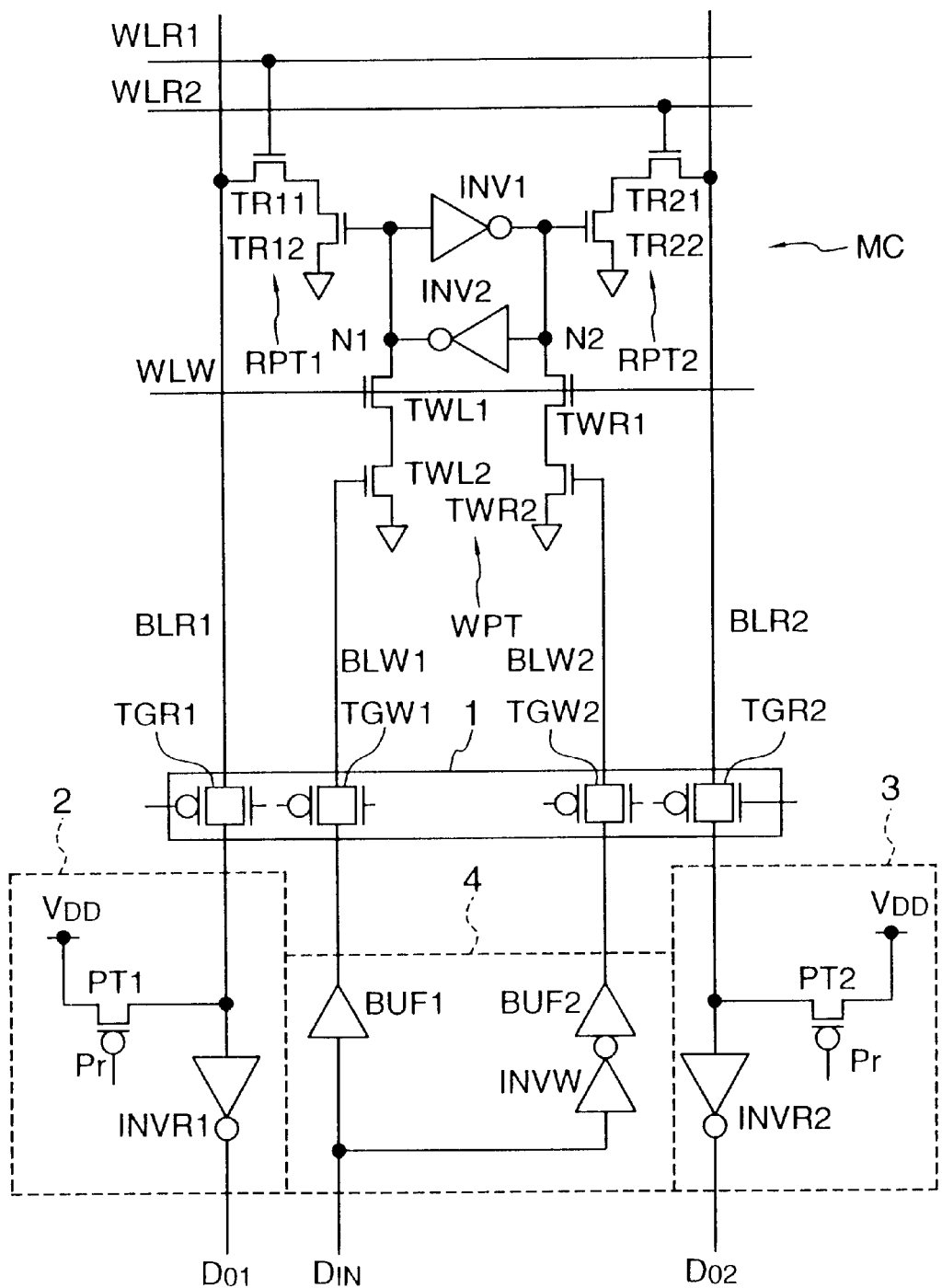
FIG. 2 is a partial circuit diagram of a multi-port type memory of the related art.
Figure 3:
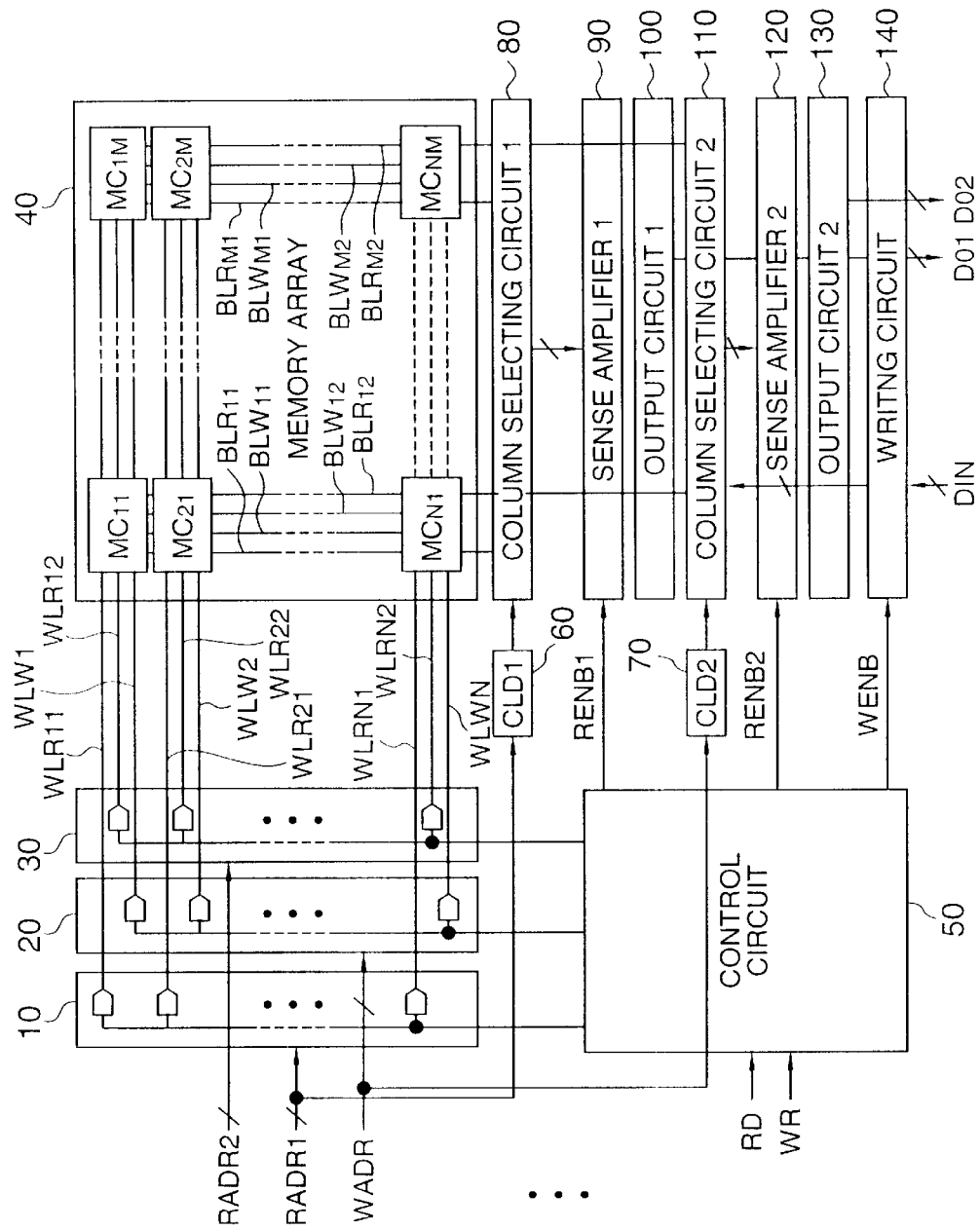
FIG. 3 is a view of the configuration of a multi-port type semiconductor memory of the related art.

According to the semiconductor memory shown in FIG. 8, the number of bit lines connected to the memory array 40a is reduced from that of the memory array 40 of the related art shown in FIG. 3. Only the pair of bit lines which are commonly used for read and write operations are connected to the each memory cell. Therefore, when structuring a memory of N×M bits, 2M number of bits are required— which is half of the number of bit lines of a memory of the related art shown in FIG. 3.

Note, according to the memory of the present invention, when the number of reading ports is increased, the number of bit lines only have to be increased by the number of increased reading ports.

Furthermore, according to the memory of the present invention, at the time of a read operation, when a write operation was carried out immediately before the read operation, one of the bit lines is already precharged, thus the number of the precharge operations can be reduced by one at the time of a read operation. Conversely, at the time of a read operation, when there is data by which bit lines are not reduced to a low level, the next write operation requires the bit line be set to a high level and the operation for setting the bit line at a high level can be omitted. As a result, the power consumption can be reduced.

As explained above, according to the present embodiment, a read and write operation can be carried out commonly using a pair of bit lines BL1 and BL2. At the time of a write operation, the levels of the bit lines BL1 and BL2 are determined in accordance with the write data, and the levels of the memory nodes N1 and N2 are determined by a writing port WPT. At the time of a write operation, the levels of the bit lines BL1 and BL2 are determined by the reading ports RPT1 and RPT2 in accordance with the memory nodes N1 and N2, and the read data is output by a sense amplifier in response to the levels of the bit lines. Therefore, the number of bit lines can be reduced by using bit lines for both writing and reading in common, the size of the memory can be reduced, and the power consumption can be reduced, as well.

Note that the present invention is not limited to the above embodiments. For example, as shown in the circuit diagram of FIG. 8, a write and read operation can be carried out by commonly using one column selecting circuit. Also, the invention is applicable to most of the circuits in semiconductor memories of the related art. Thus, only small changes are needed when designing circuits.

According to the semiconductor memory of the present invention, there are the advantages that it is possible to reduce the number of the bit lines, the size of the semiconductor memory, and the power consumption.

What is claimed is:

1. A semiconductor memory device comprising:

a memory circuit having a first memory node and a second memory node;

a pairs of bit lines;

a write word line;

a read word line;

a write port circuit including a first pair of write transfer gate circuits wherein control gates are connected to said write word line and first terminals are respectively connected to said first and second memory nodes of said memory circuit and a second pair of write transfer gate circuits where control gates are respectively connected to first and second bit lines, first terminals are respectively connected to second terminals of said first pair of write transfer gate circuit, and second terminals are connected to a first voltage line;

a read port circuit including a first read transfer gate circuit where a control gate is connected to said read word line and one terminal is connected to one of said pair of bit lines; and a second read transfer gate circuit where a control gate is connected to one of said first and second memory nodes of said memory circuit, a first terminal is connected to a second terminal of said first read transfer gate circuit, and a second terminal is connected to said first voltage line;

during a write operation, said write word line is energized to place said first pair of write transfer gate circuits in said write port circuit in a conductive state, the potentials of said pair of bit lines are inversely set in response to write data, and said write port circuit is operated by said potentials of said pair of bit line to hold said write data in said memory cell, and during a read operation, said read word line is energized to place said first read transfer gate circuit in said read port in a conductive state, said second read transfer gate circuit is operated in response to the potential at the control gate thereof to define the potential of said one of said pair of bit lines connected to said one terminal of said first read transfer gate circuit, and said potential on said bit line is sensed to provide read data.

2. A semiconductor memory device according to claim 1, wherein said memory circuit comprises a first inverter provided between said first and second memory nodes and a second inverter provided anti-parallel to said first inverter between said first and second memory nodes and said first and second inverters form a latch circuit.

3. A semiconductor memory device according to claim 1, wherein said first pair of write transfer gate circuits comprises a pair of transistors, and said second pair of write transfer gate circuits comprises a pair of transistors.

4. A semiconductor memory device according to claim 1, wherein said first read transfer gate circuit comprises a transistor and said second read transfer gate circuit comprises a transistor.

5. A semiconductor memory device according to claim 1, wherein said first voltage line is the ground potential line.

6. A semiconductor memory device according to claim 1, further comprising a second read word line and second read port circuit, said second read port circuit includes a third read transfer gate circuit where a control gate is connected to said second read word line and a first terminal is connected to second terminals of said pair of bit lines and a fourth read transfer gate circuit where a control gate is connected to another of said first and second memory nodes of said memory circuit, a first terminal is connected to a second terminal of said third read transfer gate circuit, and a second terminal is connected to said first voltage line, wherein in the read operation, said read word line and said second read word line are energized to place said first and third read transfer gate circuits in a conductive state, said second read transfer gate circuit is operated in response to the potential at the control gate thereof, and said fourth read transfers gate circuit is operated in response to the potential at the control gate thereof, to thereby define the potentials of said pair of bit lines, said potentials on said pair of bit lines being sensed.

7. A semiconductor memory device according to claim 6, wherein said third read transfer gate circuit comprises a transistor and said second read transfer gate circuit comprises a transistor.

8. A semiconductor memory device according to claim 1, further comprising a switching circuit connected to said pair of bit lines, a data read circuit, and a data write circuit, said switching circuit selecting said data write circuit to operatively connect said bit lines and said data write circuit during a write operation and selecting said data read circuit to operatively connect said bit lines and said data read circuit during a read operation.

9. A semiconductor memory device according to claim 8, wherein said data read circuit comprises a precharge circuit for precharging said bit lines to a precharge potential during a read operation.

* * * * *